(12) United States Patent
Yang et al.

(10) Patent No.: US 8,278,138 B2
(45) Date of Patent: Oct. 2, 2012

(54) RESISTIVE MEMORY DEVICE AND METHOD OF FABRICATING THE SAME

(75) Inventors: Yong Suk Yang, Daejeon (KR); In-Kyu You, Daejeon (KR); Jae Bon Koo, Daejeon (KR); Soon Won Jung, Daejeon (KR); Kang Dae Kim, Daejeon (KR); Yong-Young Noh, Deajeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 7 days.

(21) Appl. No.: 12/915,495

(22) Filed: Oct. 29, 2010

(65) Prior Publication Data

US 2011/0272661 A1    Nov. 10, 2011

(30) Foreign Application Priority Data

May 10, 2010    (KR) .................. 10-2010-0043570

(51) Int. Cl.
*H01L 51/40*    (2006.01)
(52) U.S. Cl. ..................... 438/99; 438/197; 438/238
(58) Field of Classification Search .............. 438/99, 438/197, 238
See application file for complete search history.

(56) References Cited

U.S. PATENT DOCUMENTS

| 2006/0131569 A1 | 6/2006 | Choi et al. |
| 2007/0126001 A1 | 6/2007 | Choi et al. |
| 2008/0185578 A1 | 8/2008 | Yoshizumi et al. |

FOREIGN PATENT DOCUMENTS

| JP | 2008-211185 A | 9/2008 |
| KR | 2006-0070716 A | 6/2006 |
| KR | 10-0744959 A | 7/2007 |
| KR | 2007-0079432 A | 8/2007 |
| KR | 10-0868096 A | 11/2008 |
| KR | 10-0939543 | 1/2010 |

OTHER PUBLICATIONS

L. P. Ma, et al., "Organic electrical bistable devices and rewritable memory cells", Applied Physics Letters, vol. 80, No. 16, pp. 2997-2999(2002).
L. D. Bozano, et al., "Mechanism for bistability in organic memory elements", Applied Physics Letters, vol. 84, No. 4, pp. 607-609(2004).
Y. Song, et al., "Electrically Bistable Thin-Film Device Based on PVK and GNPs Polymer Material", IEEE Electron Device Letters, vol. 28, No. 2, pp. 107-110(2007).

*Primary Examiner* — Long Pham
(74) *Attorney, Agent, or Firm* — Rabin & Berdo, P.C.

(57) ABSTRACT

Provided are a resistive memory device and a method of fabricating the same. The resistive memory device comprises an electron channel layer formed by means of a swelling process and an annealing process. Thus, conductive nanoparticles are uniformly dispersed in the electron channel layer to improve reliability of the resistive memory device. According to the method, an electron channel layer is formed by means of a printing process, a swelling process, and an annealing process. Thus, fabrication time is reduced.

7 Claims, 6 Drawing Sheets

RESISTIVE MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2010-0043570, filed on May 10, 2010, the entirety of which is hereby incorporated by reference.

BACKGROUND

1. Technical Field

The present disclosure herein relates to nonvolatile memory devices and methods for fabricating the same and, more particularly, to a resistive memory device and a method for fabricating the same.

2. Description of Related Art

In recent years, dynamic random access memory (DRAM) devices, static random access memory (SRAM) devices, and flash memory devices have been widely used as semiconductor memory devices. These semiconductor memory devices may be classified into volatile memory devices and nonvolatile memory devices. Volatile memory devices lose their stored data when their power supplies are interrupted, while nonvolatile memory devices retain their stored data even when their power supplies are interrupted. Volatile memory devices comprise DRAM devices and SRAM devices, and nonvolatile memory devices comprise flash memory devices.

A memory device used in a digital camera, an MP3 player, and a cellular phone to store data has mainly been a nonvolatile memory device, particularly, a flash memory device for storing data even when its power supply is interrupted. However, because the flash memory is configured to accumulate electric charges on a floating gate at a high electric field, a cell structure becomes complex to cause difficulty in achieving high integration. Accordingly, ferroelectric RAM (FRAM) devices, magnetic RAM (MRAM) devices, phase-change RAM (PRAM) devices, and resistive RAM (RRAM) devices have been proposed as next-generation semiconductor memory devices.

SUMMARY

Embodiments of the inventive concept provide a resistive memory device. The resistive memory device may comprise a first electrode on a substrate, an electron channel layer disposed on the first electrode, and a second electrode on the electron channel layer. A top surface of the electron channel layer is curved.

According to an example embodiment of the inventive concept, the top surface of the electron channel layer may protrude below the second electrode.

According to an example embodiment of the inventive concept, the electron channel layer may comprise an organic thin film and conductive nanoparticles dispersed in the organic thin film.

According to an example embodiment of the inventive concept, each of the first and second electrodes may be made of a conductive layer having a work function of 4 eV to 6 eV.

Embodiments of the inventive concept also provide a method of fabricating a resistive memory device. The method may comprise forming a first electrode on a substrate, forming an electron channel layer on the first electrode, and forming a second electrode on the electron channel layer. A top surface of the electron channel layer is formed to be curved.

According to an example embodiment of the inventive concept, the forming of the electron channel layer may comprise forming an organic thin film having a planar top surface, supplying a first solution comprising conductive nanoparticles and a first solvent to a predetermined region of the organic thin film, swelling the first organic thin film with the first solvent at the same time as the conductive nanoparticles permeate the organic thin film, performing an annealing process to volatilize the first solvent at the same time as the conductive nanoparticles are embedded in the organic thin film to form an electron channel layer, and forming a second electrode on the electron channel layer.

According to an example embodiment of the inventive concept, the conductive nanoparticles may be comprised in the first solvent in an amount of 5 to 20 percent by weight.

According to an example embodiment of the inventive concept, the first solution may have viscosity of 1 to 20 centipoise (cP).

According to an example embodiment of the inventive concept, the supplying of the first solution may be done by means of inkjet printing, screen printing, offset printing, flexography printing or gravure printing.

According to an example embodiment of the inventive concept, the annealing process may be performed under an inert gas ambient at a temperature ranging from 100 to 200 degrees centigrade.

According to an example embodiment of the inventive concept, the forming of the organic thin film may comprise solving an organic compound in a second solvent to produce a second solution, supplying the second solution onto the substrate, and hardening the second solution.

According to an example embodiment of the inventive concept, the supplying of the second solution may be done by means of spin coating, deep coating, inkjet printing, screen printing, offset printing, flexography printing or gravure printing.

According to an example embodiment of the inventive concept, the organic compound may be comprised in the second solvent in an amount of 0.01 to 10.0 percent by weight.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION OF THE EMBODIMENTS

Figure 1:
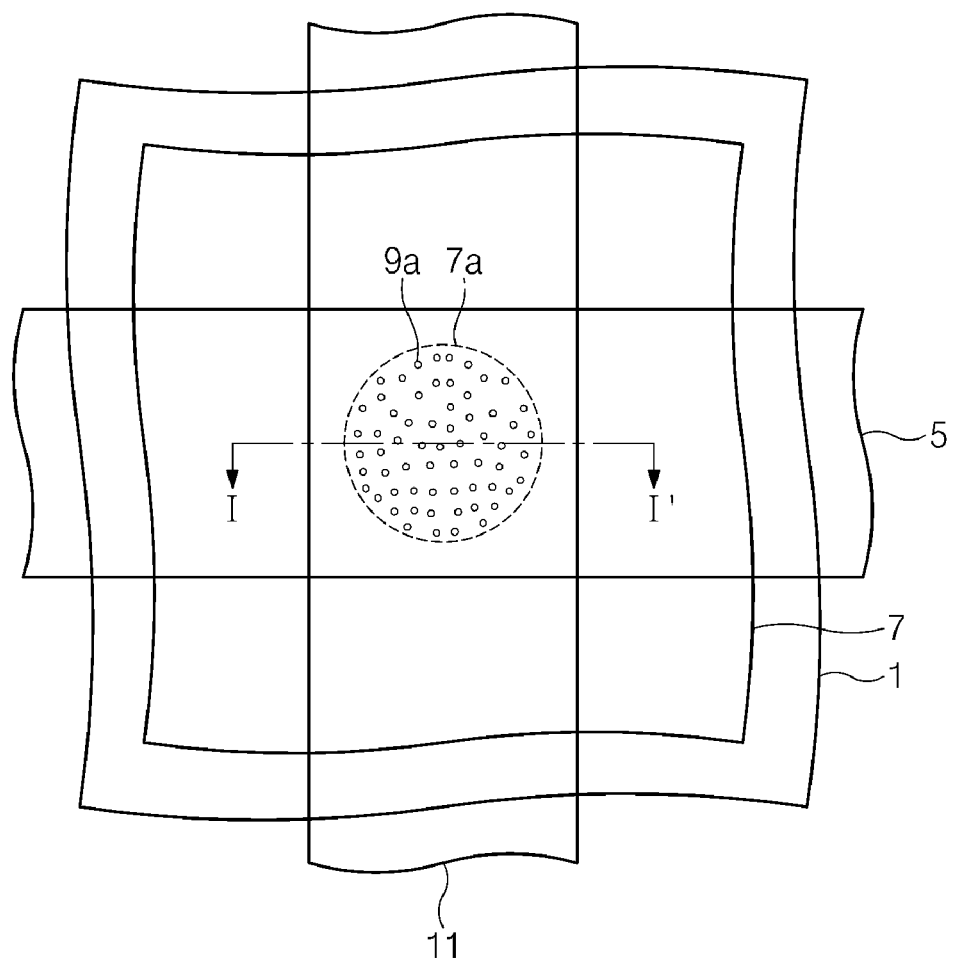
FIG. 1 is a layout view of a resistive memory device according to an embodiment of the inventive concept.

The inventive concept will now be described more fully hereinafter with reference to the accompanying drawings, in which preferred embodiments of the inventive concept are shown. However, the inventive concept may be embodied in many different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

In the specification, the dimensions of layers and regions are exaggerated for clarity of illustration. It will also be understood that when a layer (or film) is referred to as being "on" another layer or substrate, it can be directly on the other layer or substrate, or intervening layers may also be present. Also, though terms like a first, a second, and a third are used to describe various regions and layers in various embodiments of the inventive concept, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with reference to sectional views or plan views as ideal views of the inventive concept. In the drawings, the dimensions of layers and regions are exaggerated for clarity of illustration. Accordingly, shapes of the views may be modified according to manufacturing techniques and/or allowable errors. Therefore, example embodiments of the inventive concept are not limited to the specific shape illustrated in the example views, but may comprise other shapes that may be created according to manufacturing processes. For example, although an etched region is illustrated as being etched at a right angle, it may also be rounded or have a predetermined curvature. Areas exemplified in the drawings have general properties, and are used to illustrate specific shapes of device regions. Thus, these should not be construed as limiting the scope of the inventive concept.

Figure 2:
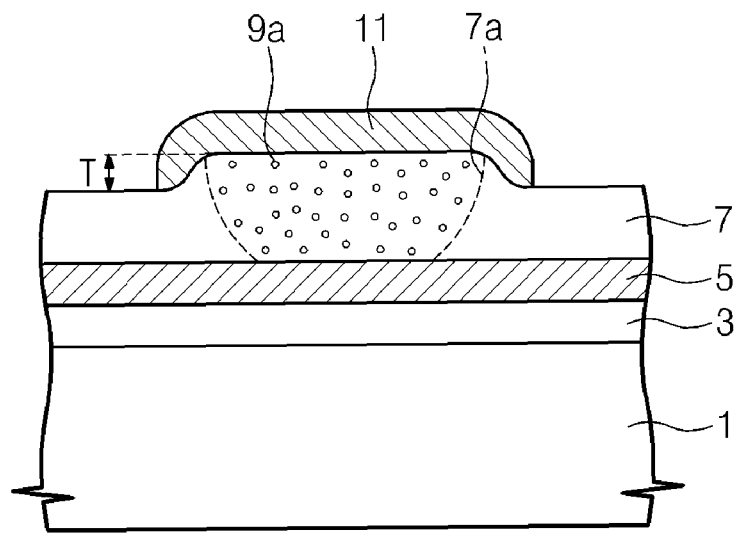
FIG. 2 is a cross-sectional view taken along the line I-I' in FIG. 1.

FIG. 1 is a layout view of a resistive memory device according to an embodiment of the inventive concept, and FIG. 2 is a cross-sectional view taken along the line I-I' in FIG. 1.

Referring to FIGS. 1 and 2, an insulating layer 3 is disposed on a substrate 1. The substrate 1 may be a semiconductor substrate such as silicon. Alternatively, the substrate 1 may be a plastic substrate such as polyethersulfone (PES), poly(ethylene terephthalte) (PET), polycarbonate (PC), and polyimide (PI). The insulating layer 3 may be a silicon oxide layer, a silicon nitride layer or an organic polymer-based dielectric layer. The dielectric layer 3 may be used as an interlayer dielectric layer. A first electrode 5 is disposed on the insulating layer 3. The first electrode 5 may have the shape of a plurality of lines arranged in parallel in one direction. The first electrode 5 and the insulating layer 3 are covered with an organic thin film 7. A second electrode 11 is disposed on the organic thin film 7 to intersect the first electrode 5. An electron channel layer 7a is disposed at an intersection of the first electrode 5 and the second electrode 7. The electron channel layer 7a is connected to the organic thin film 7 and protrudes to be higher than a top surface of the organic thin film 7 by a first thickness T. Conductive nanoparticles 9a are uniformly dispersed in the electron channel layer 7a. The electron channel layer 7a may comprise the same organic compounds as the organic thin film 7. The electron channel layer 7a may comprise the conductive nanoparticles 9a. However, the electron channel layer 7a may have a greater inter-molecular distance than the organic compounds in the organic thin film 7.

The conductive nanoparticles 9a may be at least one selected from the group consisting of metal, metal oxide, and carbon nanotube. The metal may be one selected from the group consisting of gold, silver, and copper, and the metal oxide may be one selected from the group consisting of indium tin oxide (ITO), zinc oxide (ZnO), and titanium oxide ($TiO_2$).

Each of the first and second electrodes 5 and 11 may be formed of a material having a work function of about 4 eV to 6 eV. Specifically, each of the first and second electrodes 5 and 11 may comprise at least one selected from the group consisting of aluminum, chrome, silver, copper, gold, nickel, platinum, indium tin oxide (ITO), carbon nanotube, Graphene, and a conductive organic material.

The organic compound may be at least one selected from the group consisting of poly-N-Vinylcarbazole (PVK), polyimide (PI), poly carbonate (PC), polyvinyl pyrrolidone (PVP), polyvinyl chloride (PVC), polystyrene (PS), polyfluorene (PFO), polyphenylenevinylene (PPV), epoxy (EP), polymethyl methacrylate (PMMA), polyethylene (PE), ethylene copolymer, polyvinyl alcohol (PVAL), nylon 66 (polyhezamethylene adipamide), polyethersulfone (PES), polyetheretherketone (PEEK), polybuthylene terephtalate (PBT), polyethylene terephtalate (PET), polypropylene (PP), propylene copolymer, poly(4-methyl-1-pentene) (TPX), polyacrylate polyarylate (PAR), polyacetal (POM), polyphenylene oxide (PPO), polysulfone (PSF), polyphenylene sulfide (PPS), polyvinylidene chloride (PVDC), polyvinyl acetate (PVAC), polyvinyl acetal, AS resin, ABS resin, fluorine resin, phenol formaldehyde resin (PF), melamine formaldehyde resin (MF), urea formaldehyde resin (UF), unsaturated polyester (UP), diallylphthalate resin (DAP), polyurethane (PUR), polyamide (PA), silicon resin (SI), fluorinated paraxylene, fluoropolyarylether, fluorinated polyimide, poly(α-methyl styrene), poly(α-vinylnaphthalene), poly(vinyltoluene), cis-polybutadiene, polyisoprene, poly(4-methyl-1-pentene), poly(tetrafluoroethylene), poly(chlorotrifluoroethylene), poly(2-methyl-1,3-butadiene), poly(p-xylylene), poly(α-α-α'-α'-tetrafluorop-xylylene)), poly[1,1-(2-methyl propane)bis(4-phenyl)carbonate], poly(cyclohexyl methacrylate), poly(chloro styrene), poly(2,6-dimethyl-1,4-phenylene ether), polyisobutylene), poly(vinyl cyclohexane), poly(arylene ether), poly(ethylene/tetrafluoroethylene), poly(ethylene/chlorotrifluoroethylene), fluorinated ethylene/propylene copolymer), polystyrene-co-α-methyl styrene), ethylene/ethyl acrylate copolymer), poly (styrene/10% butadiene), poly(styrene/15% butadiene), poly(styrene/2,4-dimethylstyrene), Cytop), Teflon AF, polypropylene-co-1-butene), polyacene, polyphenylene, poly(phenylenevinylene), conjugated hydrocarbon polymer such as polyfluorene, and oligomer of the conjugated hydrocarbon; condensed aromatic hydrocarbons such as anthracene, tetracene, chrysene, pentacene, pyrene, perylene, and coronene; oligomeric para substituted phenylenes such as p-quaterphenyl(p-4P), p-quinquephenyl(p-5P), p-sexiphenyl (p-6P); heterocyclic polymers such as poly(3-substituted thiophene), poly(3,4-bisubstituted thiophene), polybenzothiophene), polyisothianaphthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, and polypyrene; pyrazoline compounds, polyselenophene, polybenzofuran), polyindole, polypyridazine, benzidine compounds, stilbene compounds, triazines, substituted metallo- or metal-free porphines), phthalocyanines, fluorophthalocyanines, naphthalocyanines, fluoronaphthalocyanines, C60 and C70 fullerenes; N,N'-dialkyl, substituted dialkyl, diaryl or substituted diaryl-1,4,5,8-naphthalenetetracarboxylic diimide; fluoride derivative; N,N'-dialkyl, substituted dialkyl, diaryl or substituted diaryl 3,4,9,10-perylenetetracarboxylic diimide, bathophenanthroline, diphenoquinones; 1,3,4-oxadiazoles, 11,11, 12,12-tetracyanonaptho-2,6-quinodimethane; α,α'-bis (dithieno[3,2-b2',3'-d]thiophene; 2,8-dialkyl, substituted dialkyl, diaryl or substituted diaryl anthradithiophene; and 2,2'-bibenzo[1,2-b:4,5-b']dithiophene, a combination thereof, a compound thereof, an oligomer thereof, or a compound derivative thereof.

Next, the procedure of forming a resistive memory device having a section shown in FIG. 2 will now be described below with reference to FIGS. 3 to 6.

Figure 3:
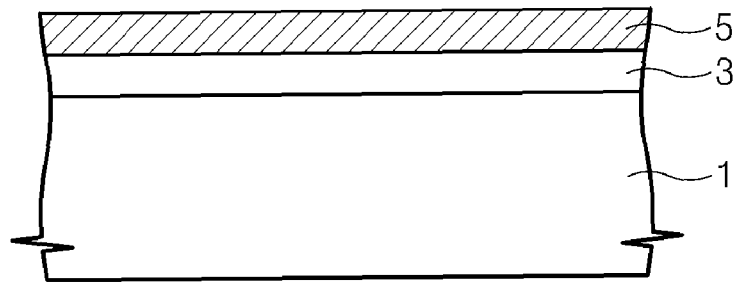
FIGS. 3 to 6 are cross-sectional views illustrating the procedure of forming a resistive memory device having a section shown in FIG. 2.

Referring to FIG. 3, an insulating layer 3 is formed on a substrate 1. Prior to the formation of the insulating layer 3, a plurality of transistors and a field oxide layer may be formed on the substrate 1. A first electrode 5 is formed on the insulating layer 3. The first electrode 5 may be formed by means of photolithography, inkjet printing, screen printing, offset printing, flexography printing or gravure printing.

Figure 4:
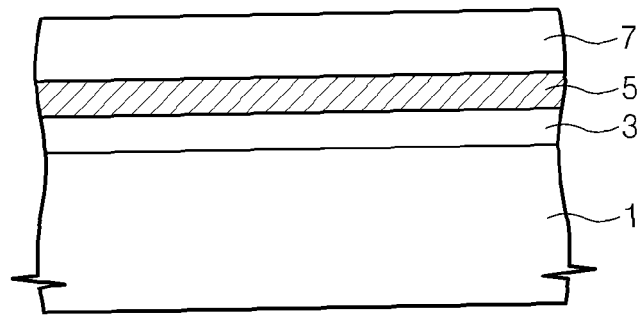

Referring to FIG. 4, an organic thin film 7 is formed on the entire surface of the substrate 1 where the first electrode 5 is formed. The organic thin film 7 may be formed to have a planar top surface. Now, the formation of the organic thin film 7 is described in detail. An organic compound is solved in a first solvent to produce a first solution. The first solution may comprise at least one selected from the group consisting of toluene, chloroform, 1,1,2,2-tetrachloroethane, tetrahydrofuran, 1,2-dichloroethane, dichloromethane, dimethylformamide, methyl ethyl ketone, 1,4-dimethylbenzene), and benzene. The organic compound is comprised in the first solvent in an amount of about 0.01 to 10.0 percent by weight. Following the production of the first solution, the first solution is supplied onto the substrate 1 by means of spin coating, deep coating, inkjet printing, screen printing, offset printing, flexography printing or gravure printing. Thereafter, the first solution is hardened by heat treatment or ultraviolet (UV) irradiation. As a result, the organic thin film 7 may be formed.

Figure 5:
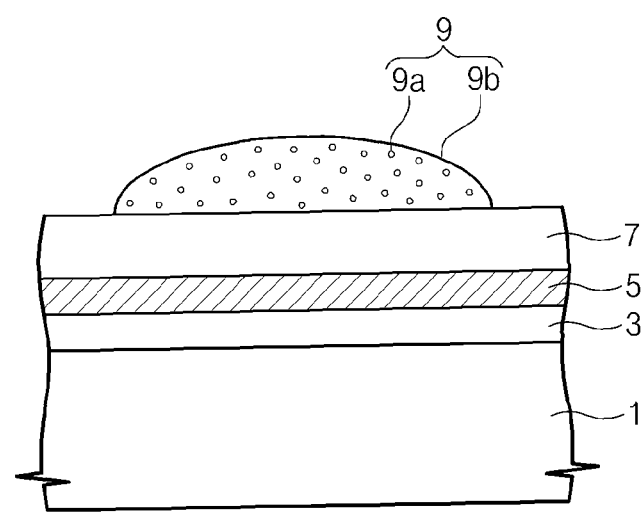

Referring to FIG. 5, a second solution 9 is supplied to a predetermined region of the organic thin film 7. The second solution 9 comprises a second solvent 9b and conductive nanoparticles 9a dispersed at the second solvent 9b. The second solvent 9b may partially solve or swell the organic thin film 7. The second solvent 9b may comprise at least one selected from the group consisting of, for example, acetaldehyde, acetic acid, acetone, amyl acetate, amyl alcohol, aniline, benzaldehyde, benzene, butanol, carbon disulphide, carbon tetrachloride, chlorine(liquid), chlorobenzene, chloroform, cyclohexanol, cyclohexanone, 1,2-dichloroethane, diethylether, 1,4-dimethylbenzene, dimethylformamide, dioxane, ethanol, ethyl acetate, methanol, methyl ethyl ketone, methyl isobutyl ketone, nitric acid, nitrobenzene, phenol, sulfuric acid, 1,1,2,2-tetrachloroethane, tetrahydrofuran, trichloroethylene, and xylene. Supplying the second solution 9 onto the organic thin film 7 may be done by means of inkjet printing, screen printing, offset printing, flexography printing or gravure printing. The second solution 9 may have viscosity of about 1 to 20 centipoise (cP). The conductive nanoparticles 9a may be comprised in the second solvent 9b in an amount of about 5 to 20 percent by weight.

Figure 6:
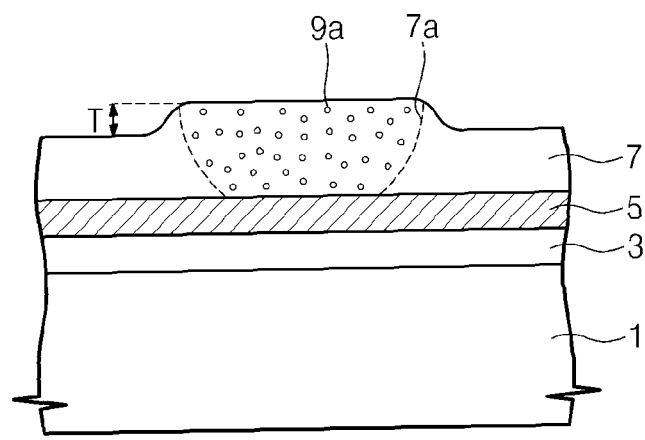

Referring to FIG. 6, after supplying the second solution 6 onto the organic thin film 7, the second solvent 9b expands (or swells) the underlying organic thin film 7 to form an electron channel layer 7a. The time required for swelling the organic thin film 7 is about 30 seconds to about 5 minutes. At the same time, the conductive nanoparticles 9a comprised in the solution 9 permeate the electron channel layer 7a. The electron channel layer 7a may protrude to be higher than the planar top surface of the organic thin film 7 by a first thickness T. In a subsequent step, an annealing process is carried out to volatilize the second solvent 9b and embed the conductive nanoparticles 9a into the electron channel layer 7a while being dispersed. The annealing process may be carried out at a temperature ranging from 100 to 200 degrees centigrade.

Due to the above swelling, annealing, and embedding processes, the conductive nanoparticles 9a may be uniformly distributed in the electron channel layer 7a. Such a manner exhibits the effect of enhancing uniformity and reproducibility during fabrication of a large-area device.

In a subsequent step, a second electrode 11 is formed on the electron channel layer 7a with reference to FIG. 2. The second electrode 11 may be formed to intersect the first electrode 5. The second electrode 11 may be formed using the same manner as the first electrode 5. A resistive memory device shown in FIG. 2 may be formed by the above-described method.

Figure 7:
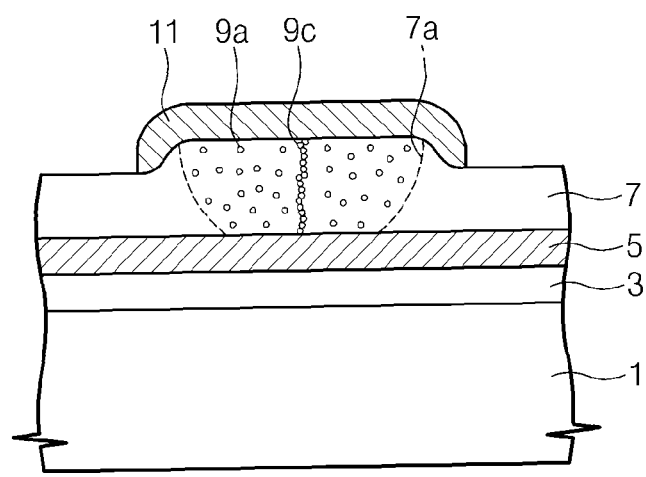
FIG. 7 illustrates the change in an electron channel layer when a voltage above a critical voltage is applied to a resistive memory device having a section shown in FIG. 2.

FIG. 7 illustrates the change in an electron channel layer when a voltage above a critical voltage is applied to a resistive memory device having a section shown in FIG. 2.

Referring to FIG. 7, at the electron channel layer 7a, an organic compound functions as an electron-donor material and a nanoparticle functions as an electron-acceptor material. When a voltage is externally applied, electron donation and acceptance occur between two heterojunctions to exhibit memory characteristics. As a detailed example, when the first electrode 5 is applied with a voltage of 0 volt and the second electrode 11 is applied with a voltage above a critical voltage (or threshold voltage or write voltage), the conductive nanoparticles 9a may migrate in the electron channel layer 7a to form a conductive micro-channel 9c. Once the conductive micro-channel 9c is formed, it cannot be removed before an erase voltage is applied.

Figure 8:
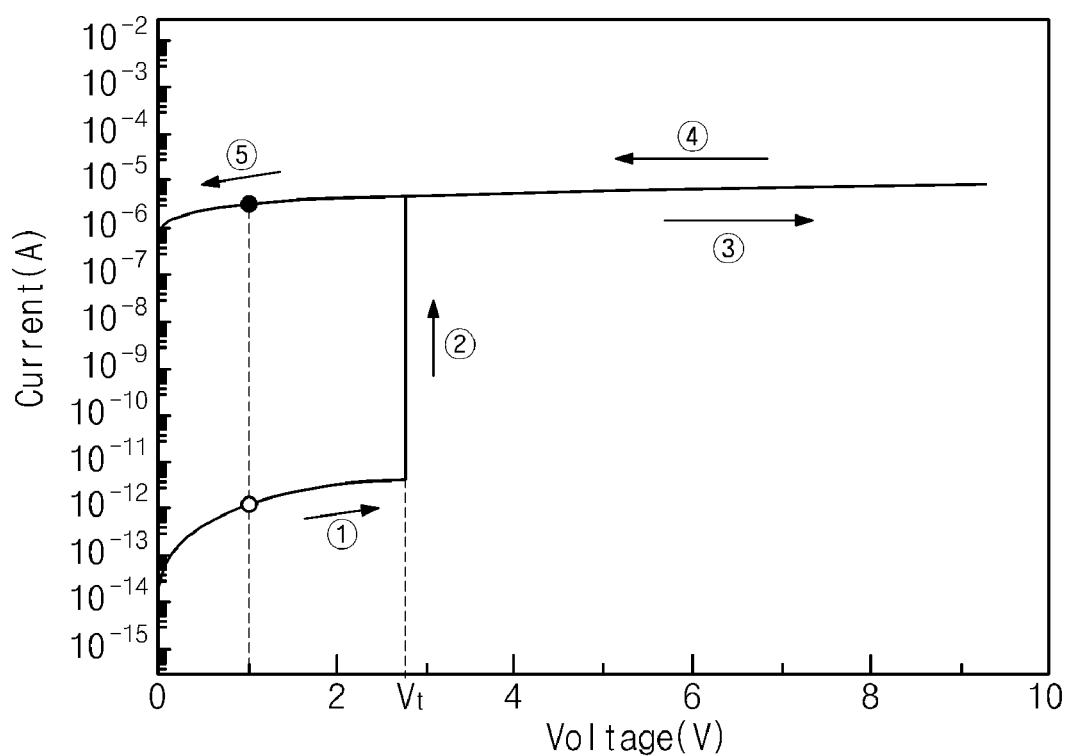
FIG. 8 is a graphic diagram illustrating a current-voltage characteristic of a resistive memory device according to an embodiment of the inventive concept.

FIG. 8 is a graphic diagram illustrating a current-voltage characteristic of a resistive memory device according to an embodiment of the inventive concept.

Referring to FIG. 8, when the first electrode 5 is applied with a voltage of 0 volt and the second electrode 11 is applied with a voltage from the □ direction to □ direction, measured current increases rapidly at a threshold voltage Vt. Although the voltage applied to the second electrode 11 drops from the □ direction to the □ direction, the current is nearly constant. The graph in FIG. 8 shows that there are two conductivity states, i.e., a high-conductivity state and a low-conductivity state between the voltage of 0 volt and the threshold voltage.

Although a voltage becomes 0 volt, these states are maintained before an erase voltage is applied. As a result, the resistive memory device according to this embodiment exhibits the characteristic of a nonvolatile memory device having a plurality of conductivity states.

Figure 9:
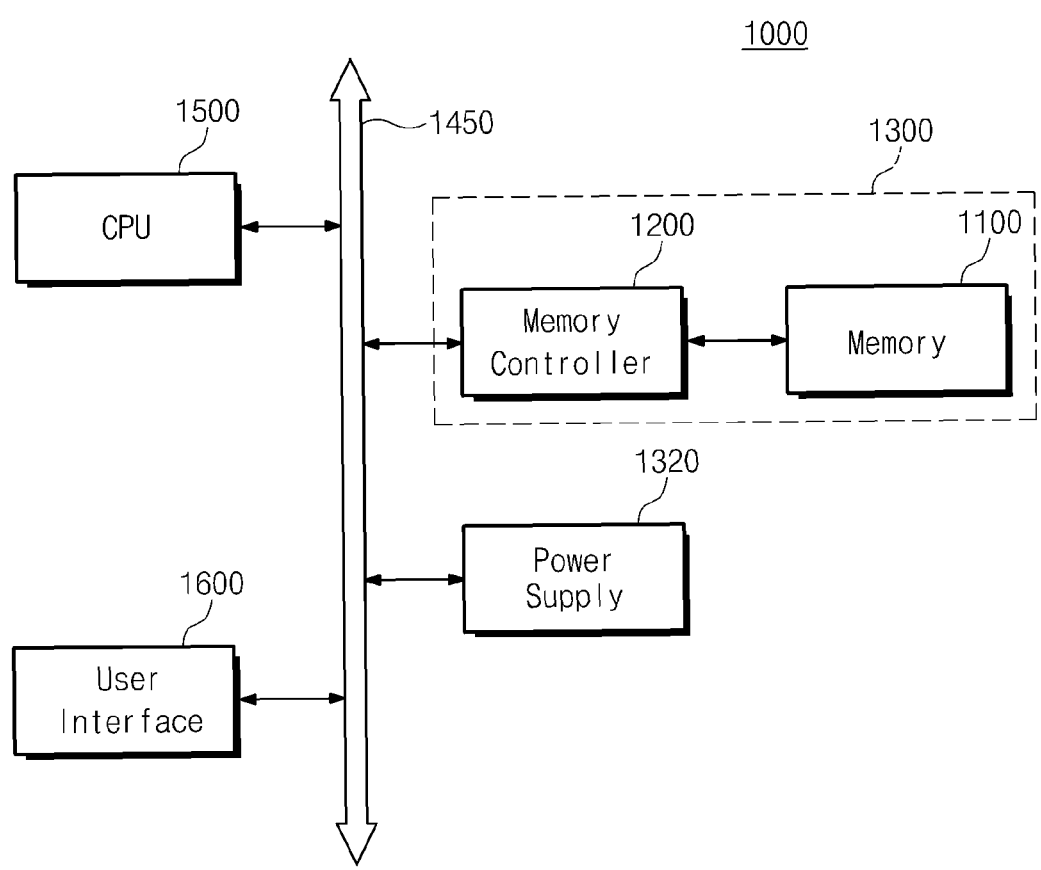
FIG. 9 is a block diagram of a memory system to which a resistive memory device according to embodiments of the inventive concept can be applied.

FIG. 9 is a block diagram of a memory system 1000 to which a resistive memory device according to embodiments of the inventive concept can be applied. As illustrated, the memory system 1000 comprises a semiconductor memory device 1300 comprising a nonvolatile memory device (e.g., resistive RAM (RRAM) 1100 according to the inventive concept) and a memory controller 1300, a central processing unit (CPU) 1500 electrically connected to a system bus 1450, a user interface 1600, and a power supply 1700.

Data provided through the user interface 1600 or processed by the CPU 1500 may be stored in the nonvolatile memory device 1100. The nonvolatile memory device 1100 may be configured with a solid-state disk (SSD), which may significantly increase the write speed of the memory system.

Although not shown in the drawings, it will be understood by those skilled in the art that the memory system 1000 according to the embodiment of the present invention may further comprise an application chipset, a camera image processor (CIS), and a mobile DRAM.

The memory system 1000 may be applied to a device such as a personal digital assistant (PDA), a potable computer, a web table, a wireless phone, a mobile phone, a digital music player, and a memory card, and all devices capable of transmitting and/or receiving information in a wireless environment.

The non-volatile memory device or memory system according to the inventive concept may be mounted in various package forms. For example, the non-volatile memory device or memory system may be packaged in a manner such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small out line package (SSOP), thin small out line package (TSOP), thin quad flatpack (TQFP), system in package (SIP), multi chip package (MCP), wafer-level fabricated package (WFP), and wafer-level processed stack package (WSP).

According to a resistive memory device of the inventive concept, an electron channel layer is formed by means of a swelling process and an annealing process. Thus, conductive nanoparticles are uniformly dispersed in the electron channel layer to improve reliability of the resistive memory device. According to a method of fabricating a resistive memory device of the inventive concept, an electron channel layer is formed by means of a printing process, a swelling process, and an annealing process. Thus, fabrication time is reduced.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a resistive memory device, comprising:
    forming a first electrode on a substrate;
    forming an organic thin film having a planar top surface;
    supplying a first solution comprising conductive nanoparticles and a first solvent to a predetermined region of the organic thin film;
    swelling the first organic thin film with the first solvent at the same time as the conductive nanoparticles permeate the organic thin film;
    performing an annealing process to volatilize the first solvent at the same time as the conductive nanoparticles are embedded in the organic thin film to form an electron channel layer; and
    forming a second electrode on the electron channel layer.

2. The method as set forth in claim 1, wherein the first solvent comprises at least one selected from the group consisting of acetaldehyde, acetic acid, acetone, amyl acetate, amyl alcohol, aniline, benzaldehyde, benzene, butanol, carbon disulphide, carbon tetrachloride, chlorobenzene, chloroform, cyclohexanol, cyclohexanone, 1,2-dichloroethane, 1,4-dimethylbenzene, dimethylformamide, dioxane, ethanol, ethyl acetate, methanol, methyl ethyl ketone, phenol, tetrahydrofuran, trichloroethylene, and xylene.

3. The method as set forth in claim 2, wherein the conductive nanoparticles are comprised in the first solvent in an amount of 5 to 20 percent by weight.

4. The method as set forth in claim 1, wherein the first solution has viscosity of 1 to 20 centipoise (cP).

5. The method as set forth in claim 1, wherein the forming of the organic thin film comprises:
    solving an organic compound in a second solvent to produce a second solution;
    supplying the second solution onto the substrate; and
    hardening the second solution.

6. The method as set forth in claim 5, wherein the organic compound is comprised in the second solvent in an amount of 0.01 to 10.0 percent by weight.

7. The method as set forth in claim 5, wherein the second solvent comprises at least one selected from the group consisting of toluene, chloroform, 1,1,2,2-tetrachloroethane, tetrahydrofuran, 1,2-dichloroethane, dichloromethane, dimethylformamide, methyl ethyl ketone), 1,4-dimethylbenzene, and benzene.

* * * * *